(12) United States Patent
Fujisawa

(10) Patent No.: US 6,192,557 B1
(45) Date of Patent: Feb. 27, 2001

(54) LOCKING DEVICE FOR SUBSTRATE SOCKETS

(75) Inventor: Shigeru Fujisawa, Suzaka (JP)

(73) Assignee: Robinson Nugent, Inc., New Albany, IN (US)

( * ) Notice: Subject to any disclaimer, the term of this patent is extended or adjusted under 35 U.S.C. 154(b) by 0 days.

(21) Appl. No.: 09/347,351

(22) Filed: Jul. 2, 1999

(30) Foreign Application Priority Data

Jul. 6, 1998 (JP) .................................................. 10-190164

(51) Int. Cl.$^7$ .............................. H01R 9/00; A44B 21/00
(52) U.S. Cl. ................ 24/457; 24/458; 24/459; 339/75 MP
(58) Field of Search .............................. 24/457, 458, 459

(56) References Cited

U.S. PATENT DOCUMENTS

| | | | |
|---|---|---|---|
| 3,991,960 | * 11/1976 | Tanaka | 24/458 |
| 4,456,318 | * 6/1984 | Shibata et al. | 339/17 CF |
| 4,515,425 | * 5/1985 | Nakano | 339/75 MP |
| 5,000,696 | * 3/1991 | Matsuoka et al. | 439/331 |
| 5,860,195 | * 1/1999 | Wang | 24/459 |

FOREIGN PATENT DOCUMENTS 5-211076   8/1993 (JP) .
6-111887   4/1994 (JP) .

* cited by examiner

*Primary Examiner*—Victor N. Sakran
(74) *Attorney, Agent, or Firm*—Barnes & Thornburg

(57) ABSTRACT

The locking device of the present invention is provided to constantly and reliably maintain the locked state even under severe environments of use, such as an application of an excessive amount of impact force, for example, and to drastically improve reliability. The locking device is equipped with a latch (2) comprising of a base end section (3), which is supported at the back side of the substrate B in a condition in which it is inserted into the substrate socket S; a base section (4) which projects out to the front side of the substrate B from this base end section (3), and a connecting section (5) having a primary connecting section (5a) and a secondary connecting section (5b) provided at the front end of this base section (4), with the primary connecting section (5a) connected to the recessed engaging section (Bh) formed at the substrate B and the secondary connecting section (5b) connected to the edge side section (Bs) of the substrate B in a locked state Mc which locks the substrate B, and the connection to the substrate B by the primary connecting section (5a) and the secondary connecting section (5b) canceled in the released state Mr in which the connecting section (5) is elastically displaced at the base end section (3) as the point of support.

12 Claims, 5 Drawing Sheets

LOCKING DEVICE FOR SUBSTRATE SOCKETS

BACKGROUND AND SUMMARY OF THE INVENTION

This invention concerns a locking device for substrate sockets which locks a substrate (electronic circuitry substrate, for example) that is inserted into a substrate socket.

Generally, electronic parts are mounted at a high density into portable personal computers, for example. The mother board that is stored inside is equipped with a substrate socket so that a memory substrate, for example, can be installed, and it can be optionally upgraded. The said substrate socket is also equipped with a locking device that locks so that the substrate that is inserted will not be removed through impact, for example.

As a conventional locking device of this type, a locking device is already known which was proposed by this applicant in the official report for the Japanese Kokai Patent Application No. Hei 8[1996]-190958, and equipped in an electronic circuitry substrate socket. This locking device has a structure in which it is equipped with a latch consisting of: a base end section, which is supported in a freely rotatable manner at the back side of the substrate in a condition in which it is inserted into a substrate socket; a base section which projects out to the front side of the said substrate from this base end section; and a connecting section which is provided at the front end of this base section, and is also equipped with a spring section which presses down this latch, and in a locked condition where the substrate is locked, the connecting section is connected to a recessed engaging section formed at the substrate, and in a released condition in which the connecting section is elastically displaced at the base end section as the point of support, the connection to the substrate at the connecting section is canceled. Through this, the operational amount of displacement of the connecting section in the direction of the surface of the substrate decreases, and high density mounting while eliminating dead space surrounding the locking device can be attained.

In the conventional locking device for a substrate socket described above, the connecting section, which is pressed down by the spring section, is connected to the substrate that is inserted into the substrate socket, locking the said substrate. Therefore, the locked state is reliably maintained in a general manner of use.

However, because a portable personal computer, for example, is carried around and utilized, the risk of an excessive amount of impact force being applied to the locking device is great when it is dropped on the ground, for example. Therefore, the capability of constantly and reliably maintaining the locked state without canceling a locking is requested in this type of locking device even under severe environments of use, such as the application of an excessive amount of impact force, for example.

This invention meets such a request in the conventional type, and its aim is to offer a locking device for a substrate socket which maintains a constant and reliable locked state under a severe condition of use, such as the application of an excessive amount of impact, for example, and the reliability can be drastically improved, while assuring the basic advantage of attaining high density mounting while eliminating dead space surrounding the locking device.

This invention for the construction of a locking device for a substrate socket S, which locks a substrate B that is inserted into a substrate socket S, has the characteristic of being equipped with a latch (2) consisting of a base end section (3), which is supported at the back side of the substrate B in a condition in which it is inserted into the substrate socket S; a base section (4), which projects out to the front side of the said substrate B from this base end section (3); and a connecting section (5), which is provided at the front end of this base section (4) and has a primary connecting section (5a) and a secondary connecting section (5b), in a locked state Mc in which the substrate B is locked, the primary connecting section (5a) is connected to the recessed engaging section Bh formed at the substrate B, and the secondary connecting section (5b) is also connected to the end section Bs of the substrate B, and in a released state Mr in which the connecting section (5) is elastically displaced at the base end section (3) as the point of support, the connection to the substrate B by the primary connecting section (5a) and the secondary connecting section (5b) is canceled.

In this case, in a satisfactory manner of implementation, the base end section (3) is positioned between the primary connecting section (5) and the secondary connecting section (5b) in the direction of the surface of the substrate B and in the direction of the displacement of the connecting section (5). Also, the base end section (3) of the latch (2) is supported in a freely rotatable manner, and the base section (4) is pressed into the locking direction by a spring section (6), and the position is also controlled at a constant position in the locking direction. On the other hand, the base section (4) engages with the inside of the recessed engaging section Bh in the locked state Mc, and controls the position of the substrate B in the direction of the surface. Also, inclined faces (5as) and (5bs), which allow the substrate B to pass by escaping when the said substrate B inserted hits the substrate socket S, and a controlling knob (7) are respectively provided to the engaging section (5).

Through this, the locking device (1) is pressed in a direction in which the base section (4) locks by the spring section (6) in a natural state, and the position is controlled at the constant position in the locking direction as well. Accordingly, the connecting section (5) escapes by the inclined faces (5as) and (5bs) when the substrate B is directly inserted into the substrate socket S, and the substrate B can be installed into the substrate socket S. Through this, the locking device (1) has the locked state Mc, the primary connecting section (5a) of the connecting section (5), which is pressed by the spring section (6), is connected to the recessed connecting section Bh formed at the substrate B, and the secondary connecting section (5b) is connected to the edge side section Bs of the substrate B, and the substrate B is locked. In the locked state Mc, because the base end section (3) is positioned between the primary connecting section (5a) and the secondary connecting section (5b) in the direction of the surface of the substrate B and in the direction of displacement of the connecting section (5), the connecting section (5) cannot be displaced at the base end section (3) as the point of support even if the substrate B attempts to escape from the substrate socket S when an external force interacts in the orthogonal direction to the substrate B. Accordingly, the locked state Mc is always and reliably maintained even under severe environments of use, such as the application of an excessive amount of impact force, for example. On the other hand, when removing the substrate B from the substrate socket S, the locking device (1) will have a released state Mr by elastically displacing the connecting section (5) with the base substrate (3) as the point of support, the connection to the substrate B by the primary connecting section (5a) and the secondary connecting section (5b) will be canceled, and the substrate B can be removed.

DETAILED DESCRIPTION OF THE DRAWINGS

Next, a satisfactory application example for this invention will be given, and it will be explained in detail based on the figures.

First, an abstract of a substrate socket S equipped with a locking device (1) in this application example will be explained while referring to FIGS. 8 and 9.

Figure 8:
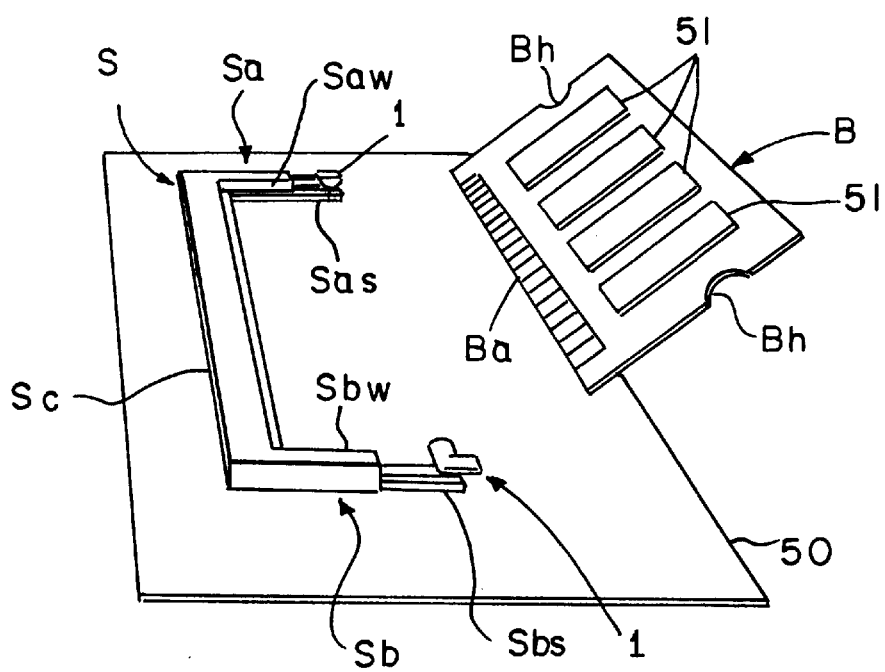
FIG. 8 is a diagram which explains the use of the substrate socket equipped with the same locking device.
Figure 9:
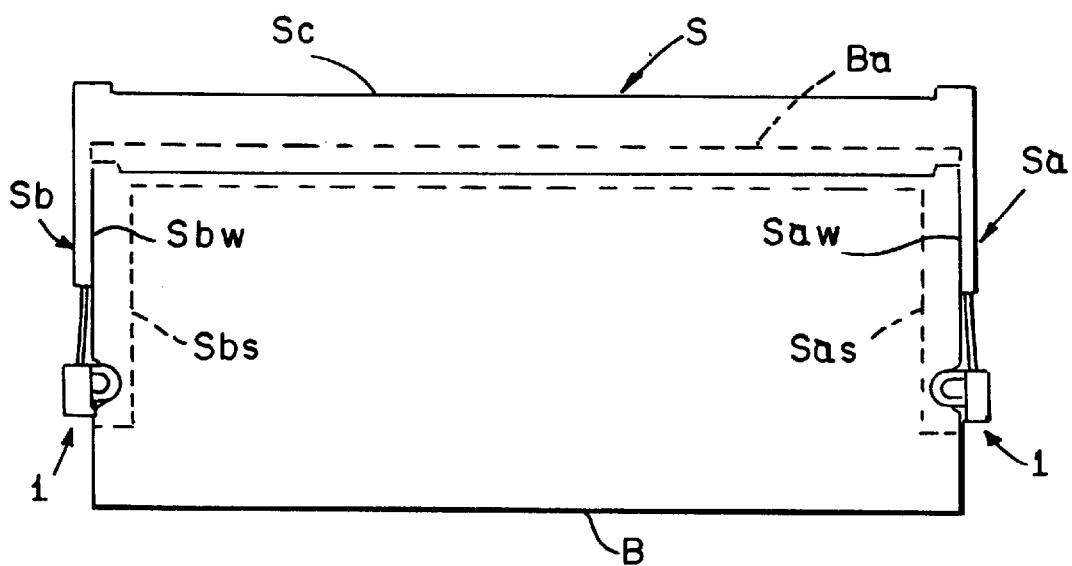
FIG. 9 is a top view diagram of the substrate socket equipped with the same locking device.

In FIG. 8, (50) and S respectively show a mother board that is built within a portable personal computer, for example, and a substrate socket that is mounted over the said mother board (50). The substrate socket S is formed into the shape of the letter 'c', has a contacting section Sc, into which a connecting end Ba of the substrate B is inserted and connected at the middle section, and has holding arm sections Sa and Sb which extend out from both sides of this contacting section Sc in an orthogonal direction and hold both sides of the substrate B. These holding arm sections Sa and Sb have substrate supporting sections Sas and Sbs, onto which the back surface of the substrate B is mounted, and base controlling sections Saw and Sbw which control the edge sections to the left and right of the substrate B. Then, locking devices (1) and (1) are respectively provided at the front ends of each of the holding arm sections Sa and Sb.

On the other hand, the substrate B is in a rectangular shape, and 4 IC (51) . . . are mounted over the surface of the substrate shown as an example. Also, the front edge section of the substrate B has the aforementioned connecting end Ba, and recessed engaging sections Bh and Bh, which are cut-off in a semi-circular shape, are formed at the left and right edge sections.

Next, the structure of the locking device (1) in this application example will be explained while referring to FIGS. 1–7. This application example shows a case in which a pair of locking devices (1) and (1) are provided at both the left and right sides. In this case, each of the locking devices (1) and (1) has the same structure except that they are symmetrical to the left and right. Accordingly, only the locking device (1) at one side will be explained below.

Figure 6:
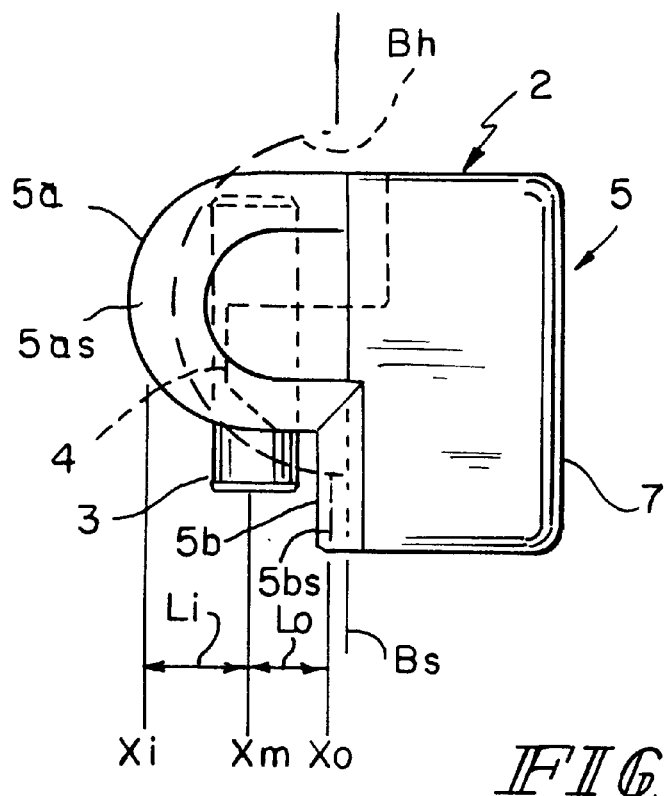
FIG. 6 is a top view diagram of the latch in the same locking device.
Figure 7:
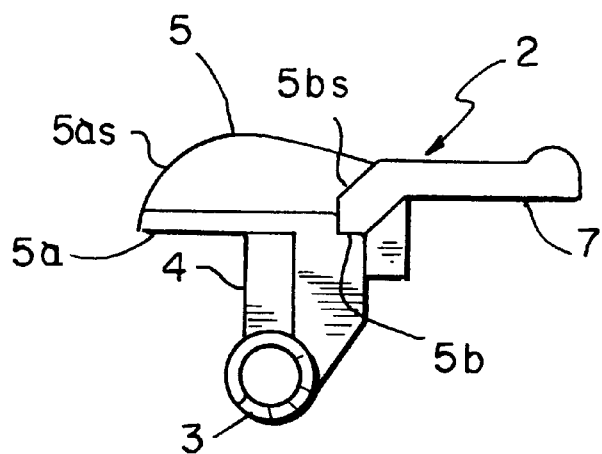
FIG. 7 is a top view diagram of the latch in the same locking device.

First, the locking device (1), as shown in FIGS. 6 and 7, is equipped with a latch (2), which is integrally formed of a synthetic resin. This latch (2) roughly consists of: a base end section (3) which is formed into the shape of a round bar; a base section (4) which projects out from the middle position of this base end section (3); and a connecting section (5) which is provided at the front end of this base section (4).

The base section (3) is supported in a freely rotatable manner at the back side of the substrate B in a condition in which it is inserted into the substrate socket S. In other words, one side of the base end section (3) is inserted into a bearing (30), which is provided to the holding arm section Sa in a lateral hole style, the other side of the base end section (3) is prevented from escaping by a controlling section (21s), which is the front end of a controlling plate section (21) projecting out from the substrate controlling section Saw, and is bent at a right angle. In this case, a hooking section (21sf), which is bent at a right angle, is provided at the front end of the controlling section (21s), and this hooking section (21sf) latches into a latching hole (31), which is provided at the substrate supporting section Sas (refer to FIGS. 2 and 5).

Also, a spring plate section (22) projects out from the substrate controlling section Saw. A spring section (6) is formed at the front end side of the spring plate section (22), and the front end of this spring section (6) makes pressure contact with the back section of the base section (4). Through this, the base section (4) is pressed into the locking direction by the spring section (6). In this case, the base section (4) is controlled by a positional controlling section (32), which is provided at the substrate supporting section Sas, and stops at a constant standing up position in the orthogonal direction of the surface of the substrate B in a natural state (refer to FIG. 4). Accordingly, the latch (2) can be elastically displaced in the direction of separating from the substrate B at the base end section (3) as the point of support. Also, the base section (4) projects out to the surface side of the substrate B in a state in which it is inserted into the substrate socket S, and during this, it has the function of engaging with the inside of the recessed engaging section Bh of the substrate B and controlling the position in the direction of the surface of the substrate B.

On the other hand, the connecting section (5) has a primary connecting section (5a) and a secondary connecting section (5b) which project out to one side in the displacement direction during a rotational displacement at the base end section (3) as the point of support. The front end of the primary connecting section (5a) is projectively formed into a semi-circular shape that is smaller than the curvature of the recessed engaging section Bh formed at the substrate B, and is connected to the recessed engaging section Bh when the latch (2) is positioned at a constant position. The secondary connecting section (5b) is extensionally provided next to the primary connecting section (5a), and is connected to the edge side section Bs, which is adjacent to the recessed engaging section Bh, when the latch (2) is positioned at a constant position (refer to FIG. 2).

Figure 1:
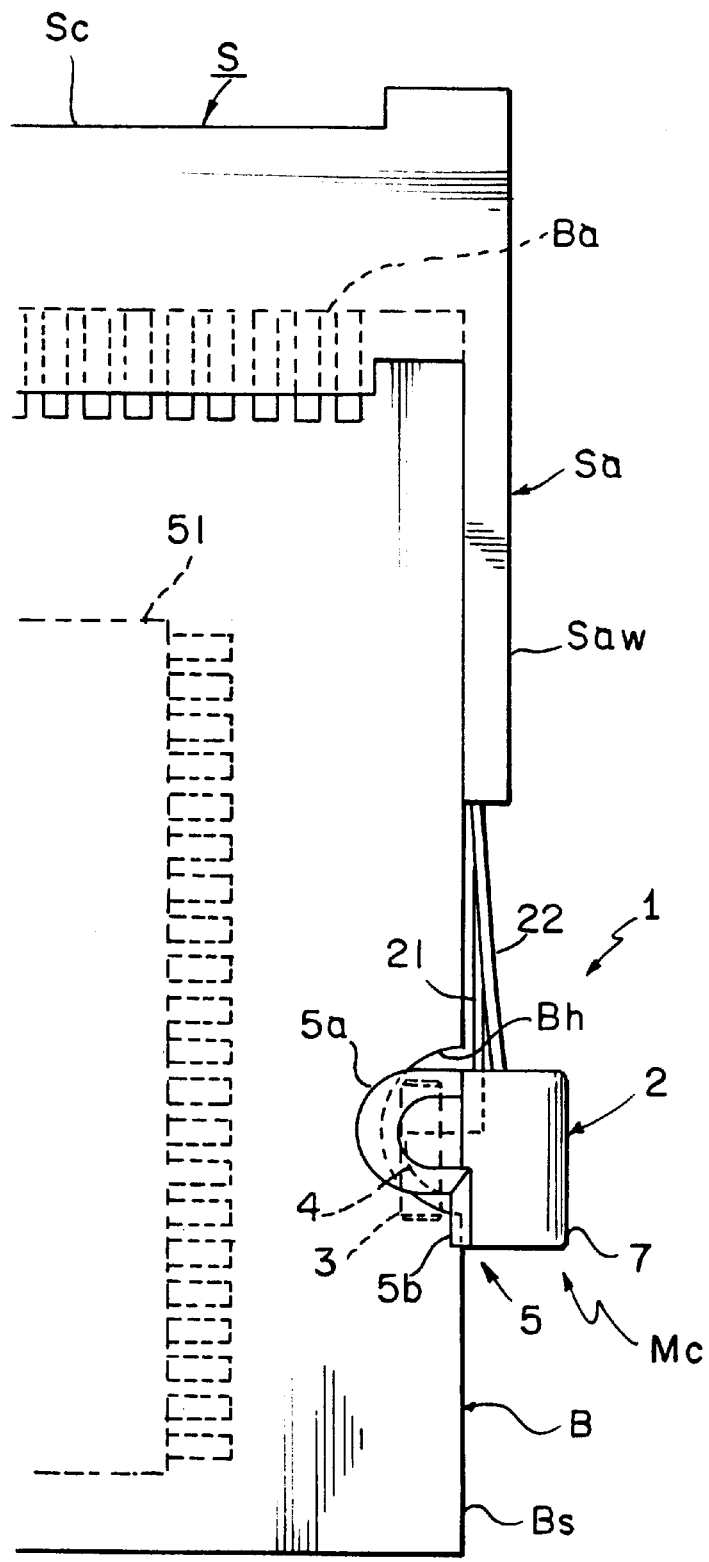
FIG. 1 is a top view diagram showing the overall locking device in the application example of this invention.
Figure 2:
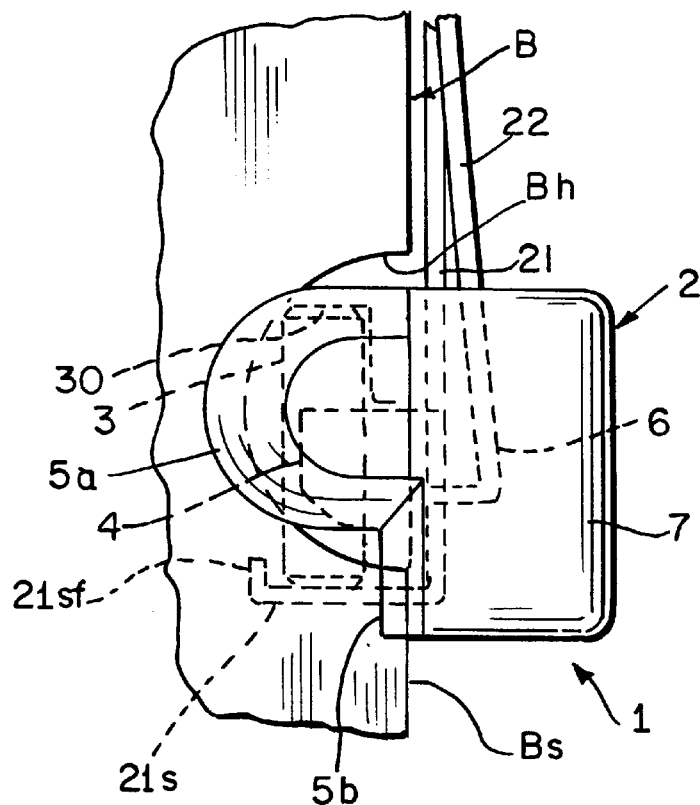
FIG. 2 is a top view diagram of an enlarged part of the same locking device.
Figure 3:
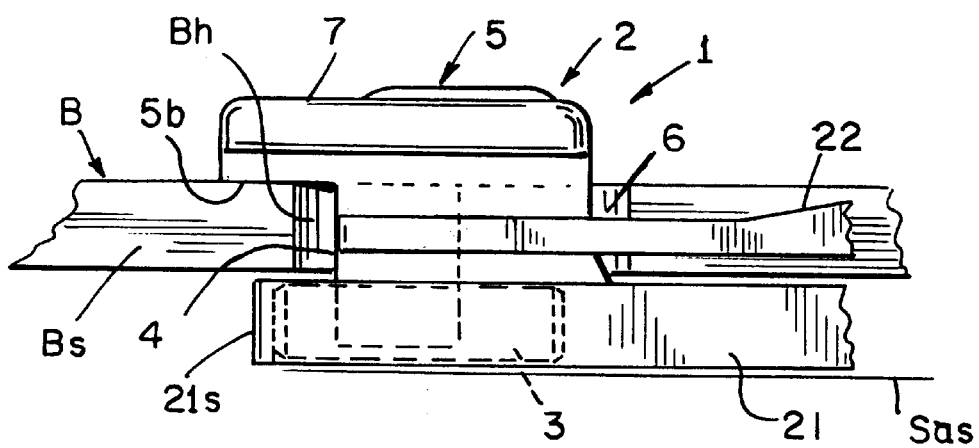
FIG. 3 is a side view diagram of an enlarged part of the same locking device.
Figure 4:
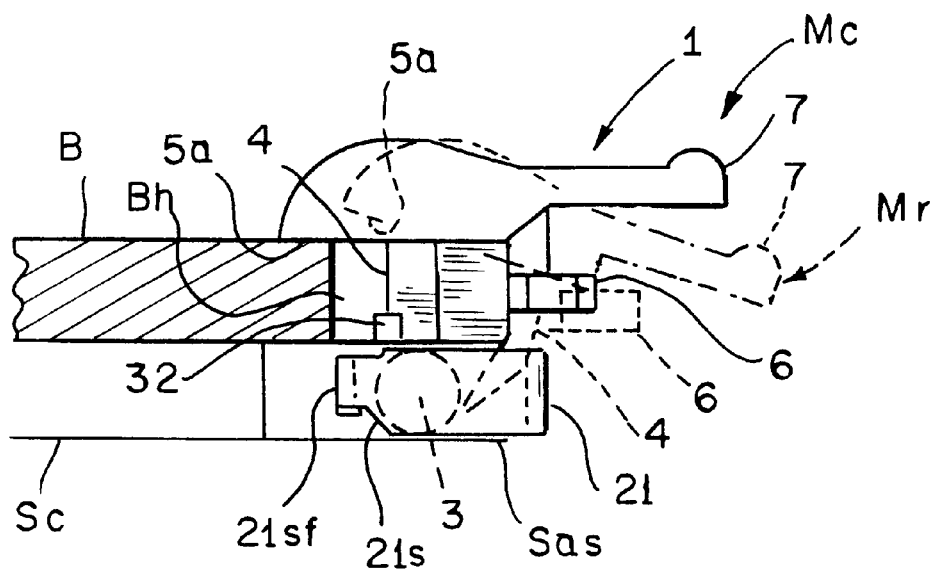
FIG. 4 is a front view diagram including a cross-section that is cut at the center of the recessed engaging section of the substrate in the same locking device.
Figure 5:
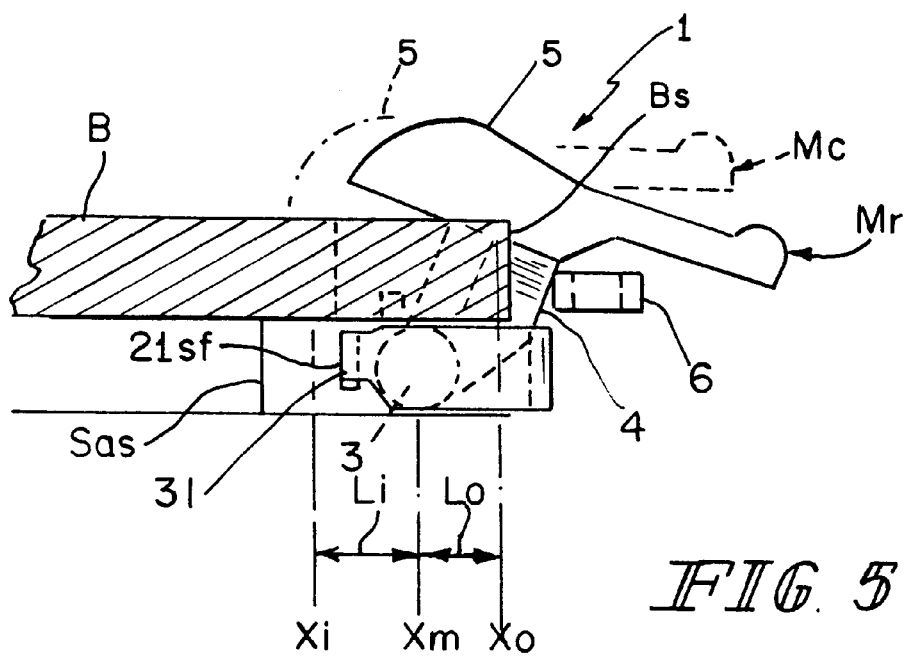
FIG. 5 is a front view diagram including a cross-section that is cut before the recessed engaging section of the substrate in the same locking device.

The significant point in this case is that the base end section (3) is positioned between the primary connecting section (5a) and the secondary connecting section (5b) in the direction of the surface of the substrate 9 and in the direction of the displacement of the connecting section (5). More precisely, when the primary connecting section (5a) and the secondary connecting section (5b) are connected to the substrate B, as shown in FIGS. 5 and 6, the positional relationship of each of the sections is set in a manner so that the connecting position Xi of the primary connecting section (5a) with the substrate. B is offset only by the distance Li from the position Xm of the base end section (3) in the direction of the surface of the substrate B and in the direction of the displacement of the connecting section (5), and the connecting position Xo of the secondary connecting section (5b) with the substrate B is offset only by the distance Lo from the position Xm of the base end section (3) in the direction of the surface of the substrate B, which is the direction of the displacement of the connecting section (5), which is in an opposite direction from the said connecting position Xi. Also, the connecting position Xo can be matched with the position Xm of the base end section (3). Through this, in a state in which the primary connecting section (5a) and the secondary connecting section (5b) are connected to the substrate B, the connecting section (5) cannot be displaced at the base end section (3) as the point of support even if an external force interacts in the orthogonal direction of the surface of the substrate B when the substrate B attempts to separate from the substrate socket S, and the locked state Mc will be constantly and reliably maintained under severe environments of use, such as an application of an excessive amount of impact force, for example.

Furthermore, inclined faces (5as) and (5bs), which allow the substrate B to pass by escaping when the said substrate B that is inserted into the substrate socket S hits, are provided at the primary connecting section (5a) and the secondary connecting section (5b) of the connecting section (5), and a controlling knob section (7), which projects out into the opposite direction of the primary connecting section (5a) and the secondary connecting section (5b) and is formed into the shape of a strip, is integrally provided at the front end of the base section (4).

Next, the method of use as well as the function of the locking device (1) in this application example will be explained while referring to each of the figures.

First, a case in which the substrate B is installed into the substrate socket S will be explained. As described above, the latch (2) stops at the constant position of standing up in the orthogonal direction to the surface of the substrate B in a natural state. Accordingly, when installing the substrate B to the substrate socket S, as shown in FIG. 8, the connecting end Ba of the substrate B is inserted diagonally from above the contacting section Sc of the substrate socket S, and the back edge of the substrate B is simultaneously lowered, and the substrate B can be mounted onto the substrate supporting sections Sas and Sbs. During this, the substrate B hits the primary connecting section (5a) and the secondary connecting section (5b) of the latch (2), but they respectively have the inclined faces (5as) and (5bs), and they escape from the elasticity of the spring section (6), and the substrate B will be allowed to pass. On the other hand, when the substrate B is completely mounted over the substrate supporting sections Sas and Sbs, the primary connecting section (5a) and the secondary connecting section (5b) will be positioned over the substrate B and they return by the elasticity of the spring section (6). Through this, the primary connecting section (5a) is connected to the recessed engaging section Bh, which is formed at the substrate B, and the secondary connecting section (5b) is connected to the edge section Bs of the substrate B. This state becomes the locked state Mc which locks the substrate B, which is basically the same position as the natural state (refer to FIG. 4).

Also, because the primary connecting section (5a) and the secondary connecting section (5b) are connected to the substrate B in the locked state Mc, the connecting section (5) cannot be displaced at the base end section (3) as the point of support even though an external force interacts in the orthogonal direction of the surface of the substrate B when the substrate B attempts to separate from the substrate socket S. Accordingly, the locked state Mc will be constantly and reliably maintained even under severe environments for use, such as an application of an excessive amount of impact force, for example, and the reliability will be drastically improved.

Next, a case in which the substrate B is removed from the substrate socket S will be explained. In this case, the controlling knob section (7) is pressed by a finger, and the latch (2) may be displaced by rotational movement. More precisely, the connecting section (5) may be elastically displaced at the base end section (3) as the point of support to a position where the connection with the substrate B by the primary connecting section (5a) and the secondary connecting section (5b) is canceled. This state becomes the released state Mr (refer to FIG. 5). Through this, locking of the substrate B by the locking device (1) is canceled, and the substrate B can be directly removed.

The point that should receive attention in this case is that the substrate B can be removed only by operating the locking device (1) at one side. More precisely, in the conventional locking method which is generally used and in which the latch is moved parallel to the direction of the surface of the substrate, it is necessary to simultaneously operate the locking devices as a pair that are provided at both the left and right sides. However, because the latch (2) in the locking device (1) in this invention is a rotational type, when the locking of the locking device (1) at one side is canceled, and one side of the substrate B is lifted up, the latch (2) of the locking device (1) on the other side follows the inclination of the substrate B and is rotationally displaced. Accordingly, the substrate B can be very easily and smoothly removed by operating the locking device (1) with one hand, and removing the substrate B with the other hand, for example. Also, the latch (2) uses a rotational type, and the basic effect of attaining high density mounting while eliminating dead space surrounding the locking device (1) can also be received.

The application example was explained in detail above, but this invention should not be limited by such an application example, and the structures, shapes, materials, and quantities, for example, of detailed sections can be optionally altered, added, and eliminated within a range that does not deviate from the substance of this invention. For example, the locking devices (1) were provided as a part of the substrate socket S, but they may be separately constructed from the substrate socket S. Also, a pair of locking devices (1) and (1) were provided at both the left and right sides in the example, but one locking device (1) may be provided. When there is only one locking device (1), a structure may be adopted which is connected at the center of the back edge side section of the substrate B. In such a case, a structure may be adopted in which the locking device (1) in particular is separate from the substrate socket S. Also, the latch (2) is pressed by the separate spring section (6) in the example shown, but the base section (4) itself may be formed of a spring material (elastic material), for example. In such a case, the separate spring section (6) becomes unnecessary, and the base end section (3) may be fixed because a rotation is not necessary. Connecting in this invention does not necessarily require making contact.

In this manner, the locking device of this invention has a structure which is equipped with a latch consisting of the base end section, which is supported at the back side of the substrate in a condition in which it is inserted into the substrate socket; a base section which projects out to the front side of the substrate from this base end section, and a connecting section having a primary connecting section and a secondary connecting section provided at the front end of this base section. The primary connecting section is connected to the recessed engaging section formed at the substrate, and the secondary connecting section is connected to the edge side section of the substrate in a locked state which locks the substrate. The connection of the substrate by the primary connecting section and the secondary connecting section is canceled in the released state in which the connecting section is elastically displaced at the base end section as the point of support. Therefore, it displays a prominent effect in which the locked state is constantly and reliably maintained, and moreover, reliability is drastically improved, even under severe conditions of use, such as an application of an excessive amount of impact force, for example, while assuring the basic advantage of attaining high density mounting while eliminating dead space surrounding the locking device.

Explanation of symbols

1. Locking device, 2. Latch, 3. Base end section, 4, Base section, 5. Connecting section, 5a. Primary connecting section, 5b. Secondary connecting section, 5as. Inclined face, 5bs. Inclined face, 6. Spring section, 7. Controlling knob section, S. Substrate socket, B. Substrate, Bh. Recessed connecting section, Bs. End side section, Mc. Locked state, and Mr. Released state.

What is claimed is:

1. A locking device for a substrate socket, which locks a substrate that is inserted into a substrate socket, characterized by being equipped with a latch consisting of: a base end section, which is supported at the back side of the substrate socket in a condition in which it is inserted into the substrate socket; a base section which projects inwardly from this base end section; and a connecting section, which is provided at the front end of this base section and has a primary connecting section and a secondary connecting section, in a locked state in which the substrate is locked, the aforementioned primary connecting section being connected to a recessed engaging section formed at the substrate, and the aforementioned secondary connecting section also being connected to abut an end section of the substrate, and in a released state in which the aforementioned connecting section is elastically displaced at the aforementioned base end section as the point of support, the connection to the substrate by the aforementioned primary connecting section and the aforementioned secondary connecting section being canceled.

2. The locking device for a substrate socket described in claim 1, characterized by the aforementioned base end section being positioned between the aforementioned primary connecting section and the aforementioned secondary connecting section in the direction of the surface of the substrate and in the direction of the displacement of the aforementioned connecting section.

3. The locking device for a substrate socket described in claim 1, characterized by the aforementioned latch of the aforementioned base end section being supported in a freely rotatable manner, the aforementioned base section being pressed into the locking direction by a spring section, and its position being controlled at a constant position in the locking direction.

4. The locking device for a substrate socket described in claim 1, characterized by the aforementioned base section engaging with the inside of the aforementioned recessed engaging section in the locked state, and controlling the position of the aforementioned substrate in the direction of the surface.

5. The locking device for a substrate socket described in claim 1, characterized by the aforementioned connecting section having inclined faces, which allow it to pass from the substrate by escaping when the said substrate inserted into the substrate socket hits.

6. The locking device for a substrate socket described in claim 1, characterized by the aforementioned connecting section having a controlling knob section.

7. A device for locking a substrate into a substrate socket and maintaining a constant and reliable locked state, the locking device comprising a latch including a base end section, a base section coupled to and extending from the base end section, and a connecting section coupled to and extending from the base section, the latch being movable between a locked position wherein the base section engages a notch formed in a side of the substrate and the connecting section engages a top surface of the substrate and a released position wherein the base section and the connecting section are displaced to disengage the substrate.

8. A substrate socket for receiving a substrate having a plurality of conductive surfaces formed thereon, the substrate socket comprising a contacting section, a holding arm section extending outwardly from the contacting section, and a locking device coupled to the holding arm section, the holding arm section having a substrate supporting section onto which a back surface of the substrate is mounted, the holding arm section engaging a side of the substrate upon insertion of the substrate into the socket to retain the substrate within the socket, the locking device including a latch for engaging a notch formed in a side edge of the substrate to provide a further retention force to the substrate, the latch being movable to disengage the side edge of the substrate.

9. A substrate socket comprising
   a contacting section adapted to receive an edge of a substrate
   a holding arm section extending outwardly from the contacting section in an orthogonal direction relative to the contacting section and
   a locking device coupled to the holding arm section, the locking device including a latch having a base end section, a base section coupled to and extending from the base end section, and a connecting section coupled to and extending from the base section, the latch being movable between a locked position wherein the connecting section enters into a notch in the side of the substrate to lock the substrate in place relative to the contacting section and a released position wherein the substrate is movable relative to the contacting section.

10. The substrate socket of claim 9, wherein a pair of holding arm sections extend from the contacting section and a pair of locking devices are coupled to the respective holding arm sections, and movement of a single locking device from the locked position to the released position allows the substrate to be removed from the substrate socket.

11. The substrate socket of claim 9, wherein the base end section is formed into the shape of a round bar.

12. A locking device for securing a substrate into a substrate socket, the locking device comprising a latch including a base end section, a base section extending from the base end section, and a connecting section extending from the base section and including a primary connecting section and a secondary connecting section, the latch being movable between a locked position wherein the primary connecting section engages a top surface of an edge defining a notch in the substrate and the secondary connecting section engages the substrate at a side edge of the substrate adjacent the side notch and a released state wherein the base section and the connecting section are displaced to disconnect the substrate from the substrate socket.

* * * * *